(12) United States Patent
Stockinger et al.

(10) Patent No.: US 8,435,064 B2
(45) Date of Patent: May 7, 2013

(54) MOUNTING FOR A DC-AC CONVERTER AND METHOD FOR FITTING A DC-AC CONVERTER

(75) Inventors: Walter Stockinger, Nussbach (AT); Jürgen Graf, Wels (AT); Markus Lebelhuber, Vorchdorf (AT)

(73) Assignee: FRONIUS International GmbH, Pettenbach (AT)

( * ) Notice: Subject to any disclaimer, the term of this patent is extended or adjusted under 35 U.S.C. 154(b) by 0 days.

(21) Appl. No.: 13/138,413

(22) PCT Filed: Feb. 8, 2010

(86) PCT No.: PCT/AT2010/000036
§ 371 (c)(1),
(2), (4) Date: Aug. 11, 2011

(87) PCT Pub. No.: WO2010/091445
PCT Pub. Date: Aug. 19, 2010

(65) Prior Publication Data
US 2011/0294336 A1    Dec. 1, 2011

(30) Foreign Application Priority Data

Feb. 12, 2009    (AT) .................................. A 240/2009

(51) Int. Cl.
*H01R 13/64*    (2006.01)
(52) U.S. Cl.
USPC ........................................................ 439/376
(58) Field of Classification Search .................. 439/376, 439/374, 342
See application file for complete search history.

(56) References Cited

U.S. PATENT DOCUMENTS

| | | | | |
|---|---|---|---|---|
| 5,641,296 | A | * | 6/1997 | Larabell et al. ............... 439/342 |
| 5,752,838 | A | * | 5/1998 | Nishizawa ....................... 439/52 |
| 6,817,881 | B2 | * | 11/2004 | Chou ............................. 439/342 |

(Continued)

FOREIGN PATENT DOCUMENTS

| | | |
|---|---|---|
| DE | 20 2006 003 596 | 7/2006 |
| DE | 20 2006 009 906 | 10/2006 |

(Continued)

OTHER PUBLICATIONS

International Search Report of PCT/AT2010/000036, Apr. 23, 2010.

(Continued)

*Primary Examiner* — Phuong Dinh
(74) *Attorney, Agent, or Firm* — Collard & Roe, P.C.

(57) ABSTRACT

The invention relates to a mounting (6) for a dc-ac converter (3) in a photovoltaic system (1), the mounting being designed to detachably accommodate the converter (3). The converter (3) can be connected to at least one solar module (2) and an alternating current supply (4) via at least one connection cable (5). The invention also relates to a method for fitting a dc-ac converter (3) to a mounting (6) of this type. To allow the simple and rapid fitting of the dc-ac converter (3), a first part (8) of a connector (7) for connecting the connection cable (5) of the dc-ac converter (3) and also a device (9) for guiding the converter are provided on the mounting (6), the guide device (9) being designed to automatically bring the first part (8) of the connector (7) into contact with a second part (10) of the connector (7) that is located on the dc-ac converter (3).

5 Claims, 4 Drawing Sheets

U.S. PATENT DOCUMENTS

| | | | |
|---|---|---|---|
| 6,851,985 B2 * | 2/2005 | Lafragette et al. | 439/701 |
| 7,491,884 B2 | 2/2009 | Schmidt et al. | |
| 7,762,828 B2 * | 7/2010 | Yeh et al. | 439/342 |
| 7,768,799 B2 * | 8/2010 | Cramer et al. | 361/823 |
| 2004/0201972 A1 | 10/2004 | Walesa | |

FOREIGN PATENT DOCUMENTS

| | | |
|---|---|---|
| DE | 10 2006 028 522 | 12/2007 |
| DE | 20 2008 007 846 | 10/2008 |
| EP | 1 524 890 | 4/2005 |
| JP | 2001-044482 | 2/2001 |
| WO | WO 2004/026013 | 3/2004 |
| WO | WO 2008/028505 | 3/2008 |

OTHER PUBLICATIONS

Austrian Office Action dated Sep. 16, 2009 in Austrian Application No. A 240/2009 with English translation of relevant parts.

* cited by examiner

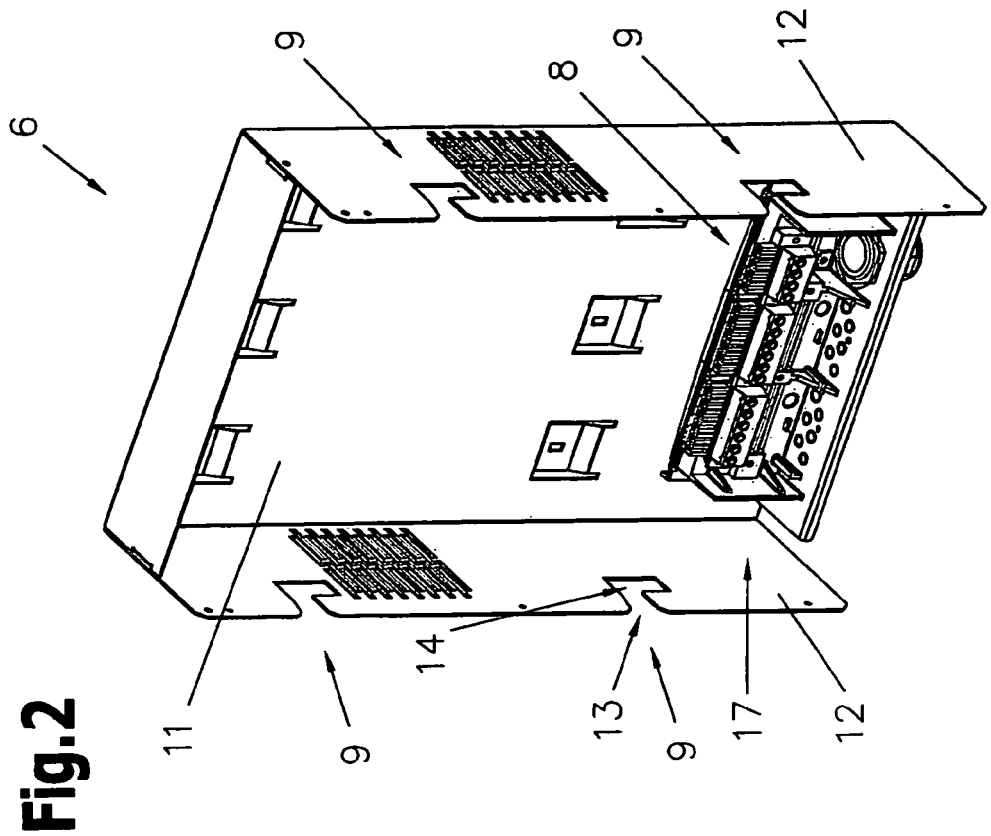
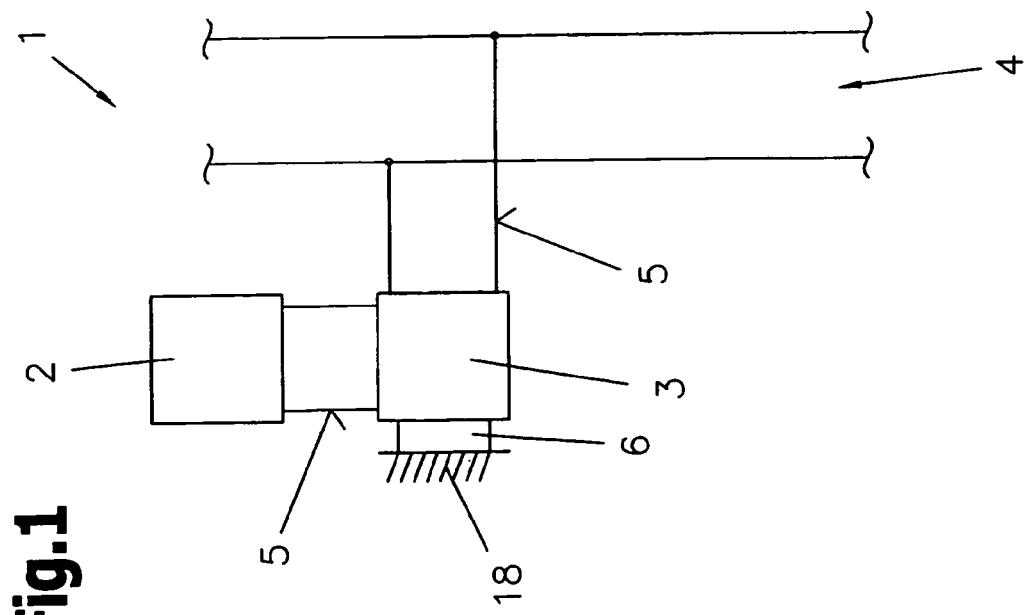

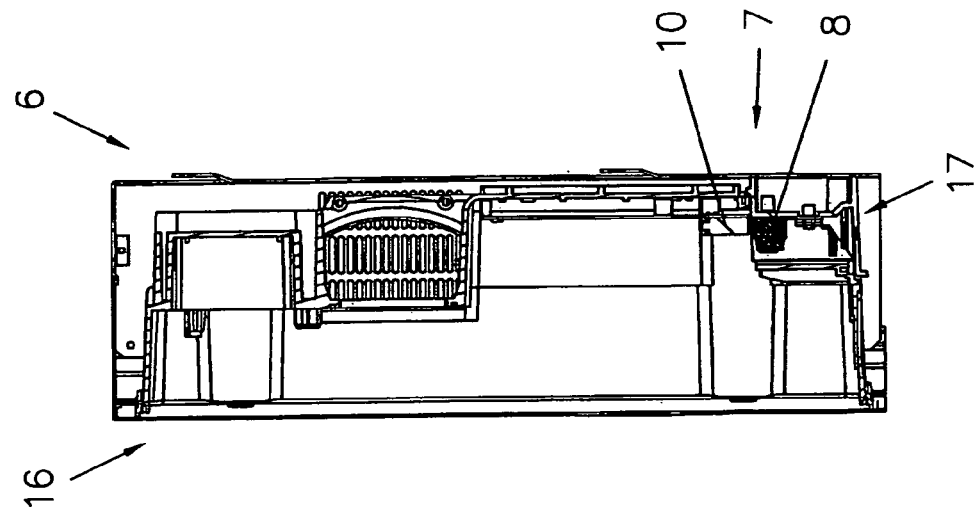
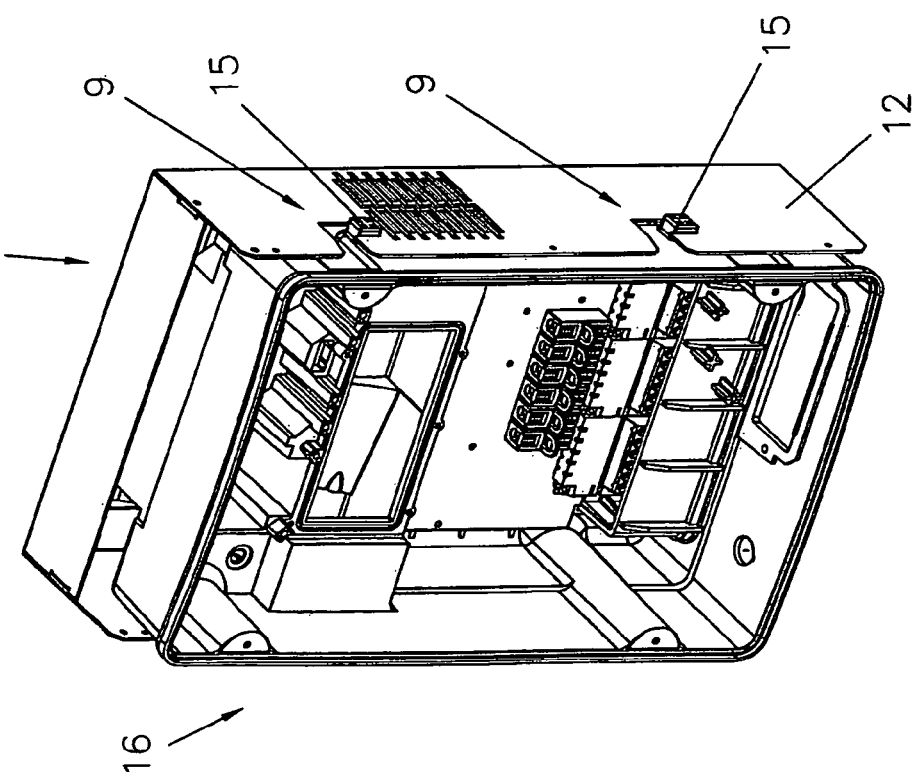
Fig.5
Fig.6

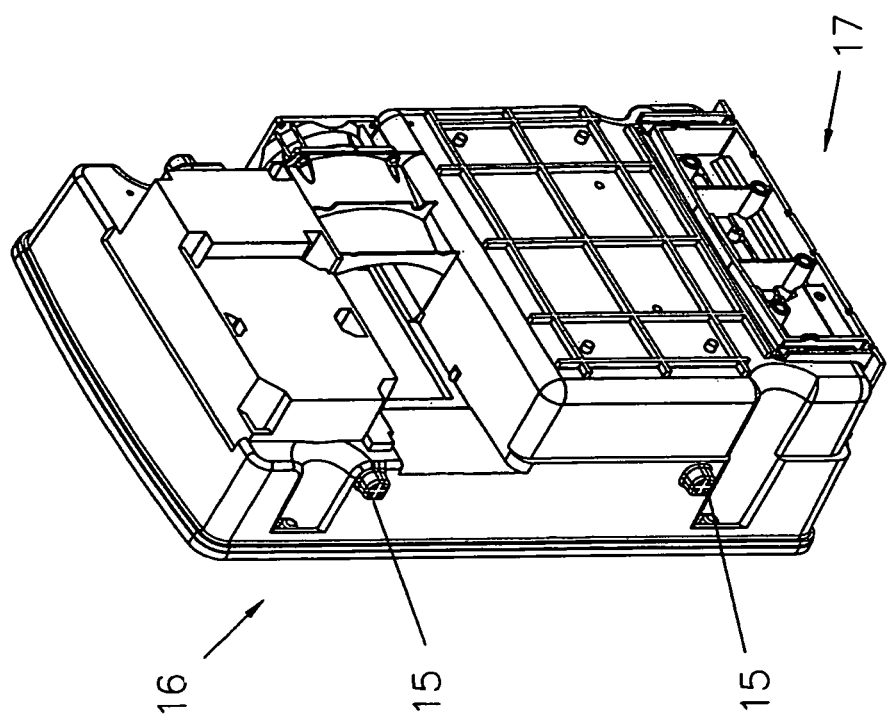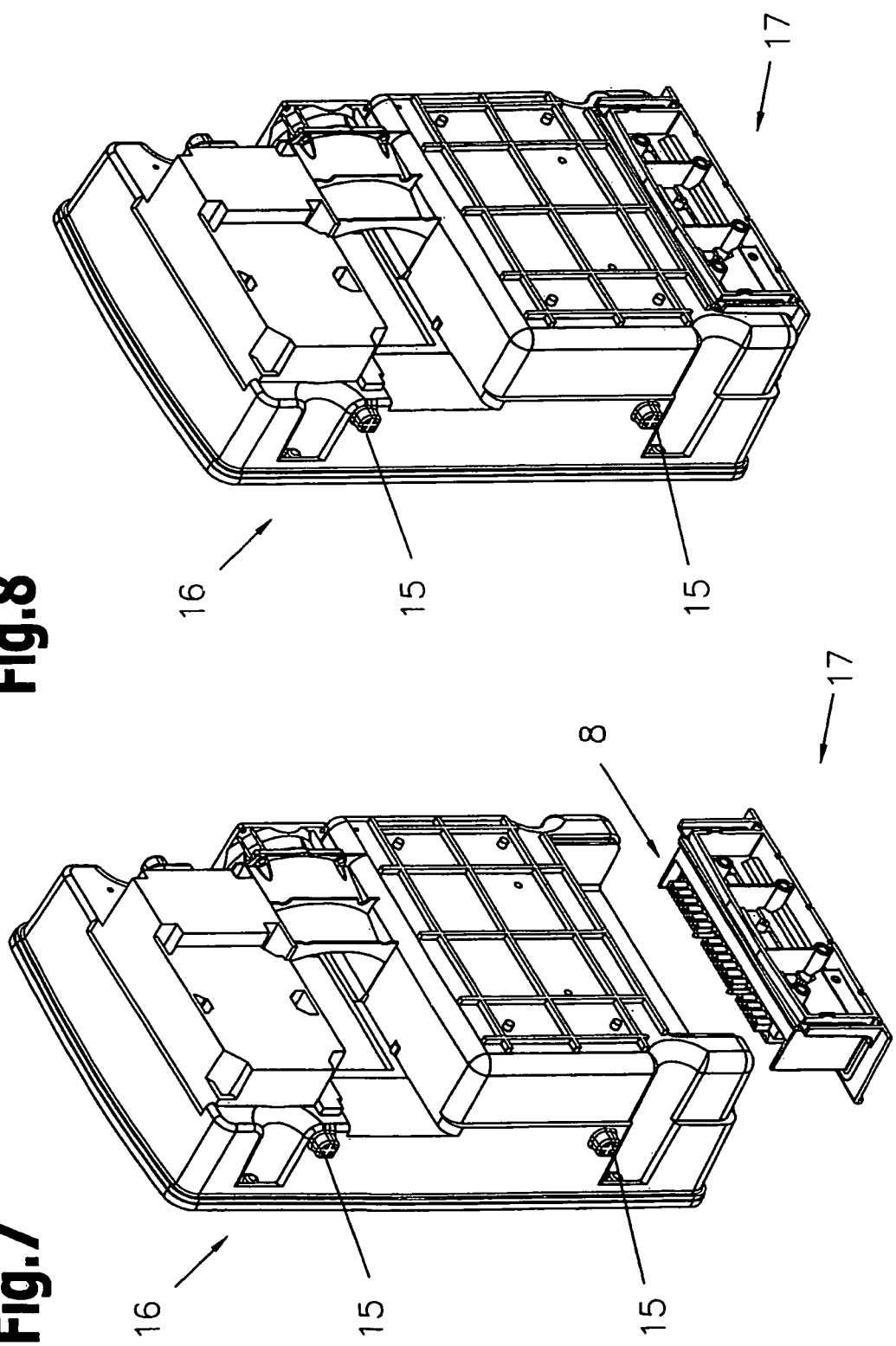

MOUNTING FOR A DC-AC CONVERTER AND METHOD FOR FITTING A DC-AC CONVERTER

CROSS REFERENCE TO RELATED APPLICATIONS

This application is the National Stage of PCT/AT2010/000036 filed on Feb. 8, 2010, which claims priority under 35 U.S.C. §119 of Austrian Application No. A 240/2009 filed on Feb. 12, 2009, the disclosure of which is incorporated by reference. The international application under PCT article 21(2) was not published in English.

The invention relates to a mounting for an inverter of a photovoltaic system, said mounting being designed to detachably accommodate the inverter, wherein the inverter can be connected to at least one solar module and an alternating current supply via at least one connection cable.

The invention also relates to a method for fitting an inverter of a photovoltaic system, wherein a housing of the inverter is hooked to a mounting and the inverter is connected to at least one solar module and an alternative current supply via at least one connection cable for each.

DE 20 2006 009 906 U1 discloses a rack for detachably fitting a plurality of inverters. Herein, the individual inverters have to be connected to the respective clamps of a clamping block by means of their power input and output cables.

DE 10 2006 028 522 A1 discloses a wall mounting for an inverter comprising holding means for detachably receiving the inverter. A disadvantage here is that the connection cables have to be connected individually directly to the inverter. Accordingly, sufficient accessibility has to be guaranteed in the proximity of the ports, thereby increasing the space required for the inverter. Also, especially maintenance work during operation of the inverter is made difficult, as the inverter has to be opened and each connection cable has to be disconnected individually, thus increasing the costs for maintenance work.

WO 2008/028205 A1 discloses a modular inverting system, wherein the inverter is formed by a connecting module and a power module that are connected to each other via corresponding plug elements. A disadvantage here is that the inverter is composed of two separate housing portions, both of which have to be mounted to a respective wall, for example. As a consequence, two separate wall mountings, which have to be installed with high precision in order for the plug elements to be connectible, are required. In addition, the connecting module is intended for multiple inverters and/or power modules and therefore has accordingly large dimensions. This is not relevant in larger photovoltaic systems with from several hundred kW to some MW.

In general, the connection cables are connected by special plugs that are called solar plugs. Here, a plug has to be attached to the end of each individual connection cable, and then the individual plugs have to be connected to a special coupling in the inverter. For attaching the plugs, appropriate tools are required in order to crimp the plugs, for example, so that the necessary electrical contact can be guaranteed. A disadvantage is that the special plugs and/or couplings are substantially adapted to only one type of cross-section of the connection cable and that plugs from different manufacturers are not compatible, either. As a consequence, labour for the assembler increases and the costs rise accordingly.

It is the object of the invention to create an above mounting and an above method for fitting the inverter as simple and quick as possible.

The object of the invention is solved by providing a first part of a plug connector for connecting the connection cables of the inverter, and further providing a device for guiding the inverter, wherein the guiding device is designed to automatically contact the first part of the plug connector to a second part of the plug connector, which is arranged on the inverter.

Moreover, the object of the invention is also solved by a method mentioned above, wherein in a first step the connection cables are connected to a part of a plug connector that is connected to the mounting, and in a second step the inverter, which is provided with a second part of the plug connector, is automatically brought into contact with the first part of the plug connector by being hooked to the mounting.

An advantage here is that the connection cables can be connected to the first part of the plug connector before fitting the inverter. An inverter that is able to operate on its own can thus be hooked to the mounting and be connected to the solar modules and the alternating current supply via the connecting cables. Another advantage is that the inverter does not have to be disconnected from the connection cables in case of service operations. Quick replacement and an accordingly short downtime of the inverter can therefore be guaranteed. Advantageously, the weight of the inverter is borne by the mounting and not by the plug connectors, so the plug connectors will have a long life. The mounting can also be done live-line, for example during the day, when a voltage is available from the solar modules, without endangering the assembler. This is possible because it is not necessary to open the inverter.

The mounting according to the invention also allows to achieve a compact make-up of the inverter as the plug connector for connecting the inverter to the connection cables requires very little space. Another reason for this is that substantially no accessibility to the plug connector is required, as the connection cables are already connected before fitting the inverter. As a consequence, the plug of the plug connector, in particular, can be protected by the housing. Furthermore, the length of the further lines attached to the connection cables can be kept extremely, short, so power loss is minimised. The connection cables can be connected to the first part of the plug connector without additional labour, such as attaching a plug to every single connection cable.

Further advantages will be evident from the following description of an embodiment.

The present invention will be explained in more detail by way of the attached schematic drawings, in which:

FIG. 1 shows the schematic make-up of a photovoltaic system;

FIG. 2 shows the mounting according to the invention;

FIG. 5 shows the mounting and the housing after fitting it;

FIG. 6 shows a section of the mounting and the housing of the inverter after fitting it;

FIG. 7 shows a rear view of the housing of the inverter and a part of the mounting with the plug connector disconnected; and FIG. 8 shows a rear view of the housing of the inverter and a part of the mounting with the plug connector connected.

As an introduction, it is noted that like parts of the embodiment are designated by like reference numerals.

Figure 4:
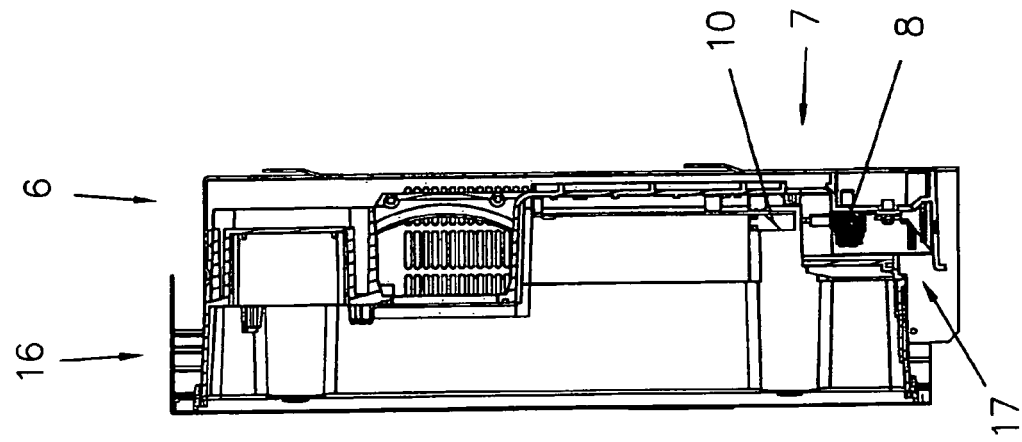
FIG. 4 shows a section of the mounting and the housing before fitting it.

FIG. 1 shows a block diagram of a photovoltaic system 1 comprising an inverter 3 that is connected to at least one power source, such as a solar module 2, and an alternating current supply 4 and/or a consumer. Direct current supplied by the solar module 2 is turned into alternating current for the alternating current supply 4 by the inverter 3. The inverter 3 is connected to the solar module 2 and the alternating current supply 4 via corresponding connection cables 5 or connection lines. In addition, connection cables 5 for an external current supply of the inverter 3 may be provided. The inverter 3 is preferably fixed to a rigid body 18, such as a wall, a ceiling, a roof or the like, by a corresponding mounting 6.

According to the invention, the mounting 6 is designed in such a way that when fitting the inverter 3, it is automatically connected to at least the connection cables 5 of the solar modules 2 and the alternating current supply 4 via a plug connector 7 that is attached to the mounting 6.

All connection cables 5 required for the inverter 3—that is, at least those for connecting it to the solar modules 2 and the alternating current supply 4—are connected to a first part 8 of the plug connector 7, which is fixed to the mounting 6. Preferably, the mounting 6 is already attached to a solid body 18, such as a wall, a ceiling, a rack or the like. This means that the connection cables 5 can be connected without the inverter 3 being present. The inverter 3 can now be hooked to the mounting 6 easily via at least one suitable guiding device 9, with the inverter 3 being automatically connected to the connection cables 5 and accordingly secured within the mounting 6 during hooking and/or fitting. For this, the inverter 3 comprises a second part 10 of the plug connector 7 that is formed to match the first part 8 of the plug connector 7, which parts 8, 10 of the plug connector 7 are automatically contacted and/or connected when the inverter 3 is hooked to the mounting 6.

Figure 3:
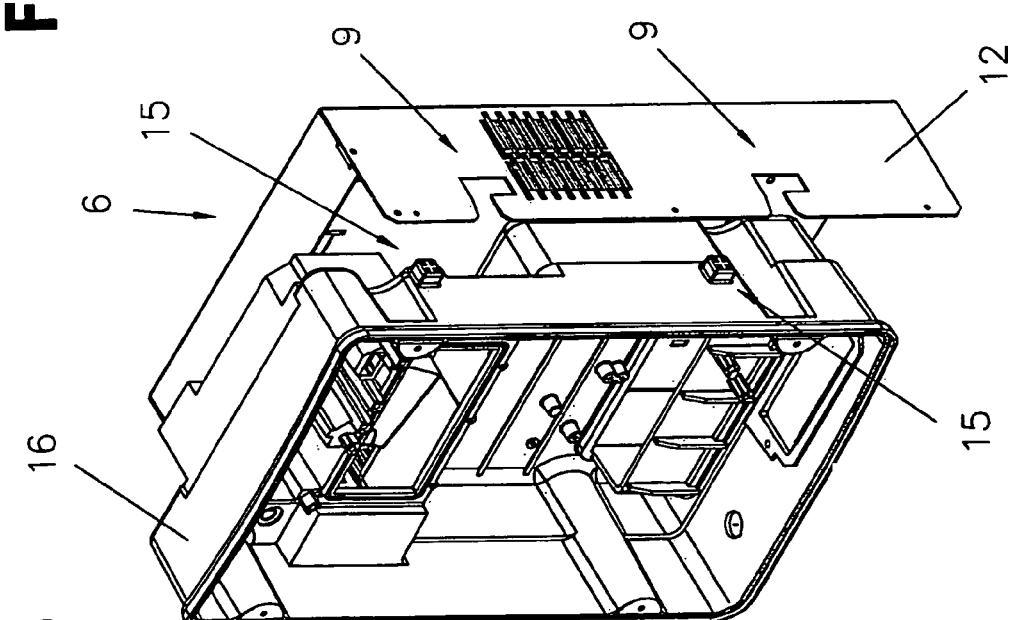
FIG. 3 shows the mounting according to the invention and the housing of the inverter before fitting it.

An embodiment of the mounting 6 is illustrated in FIGS. 2 to 8.

The mounting 6 is formed by a rear wall 11, two side walls 12 and the first part 8 of the plug connector 7, said first part 8 of the plug connector 7 being designed as a coupling. Therefore, the second part 10 of the plug connector 7 on the inverter 3 is formed by a plug that corresponds to the coupling.

Preferably, the first part 8 of the plug connector 7 is arranged in the lower part of the mounting 6, so that the space required for the connection cables 5, which are appropriately connected to the first part 8 of the plug connector 7, can be kept small in the mounting 6 as well as in the inverter 3. In the region of the first part 8 of the plug connector 7 or the coupling, the rear wall 11 can also be shaped angular, so that the first part 8 or the coupling abuts on the angle. In this case, corresponding through channels for the connection cables 5 are provided in the region of the angle of the rear wall 11, which can also be used to relieve the connection cables 5 from tension.

The mounting 6 can also be adjusted to the requirements of the inverter 3 by providing cooling slots in the side walls 12, for example.

For hooking and/or fitting the inverter 3, guiding devices 9 are integrated into the side walls 12 of the mounting 6. In these guiding devices 9, a respective guiding bolt 15, arranged on a housing 16 of the inverter 3, is being guided. The guiding device 9 is, for example, formed by a first horizontal guiding groove 13 and a second vertical guiding groove 14. During fitting, the inverter 3 is first pushed towards the rear wall 11 and then guided down towards the first part 8 of the plug connector 7 or coupling. While being guided down along the vertical guiding groove 14, the automatic contacting between first part 8 and second part 10 of the plug connector 7 is effected. At this point, the position of the guiding device 9 is aligned with the position of the plug connector 7 in such a way that the following criteria are fulfilled substantially at the same time (see FIGS. 4 to 6):

The first criterion is that after pushing the inverter 3 towards the rear wall 11—that is, along the horizontal guiding groove 13—the first part 8 and the second part 10 of the plug connector 7, or the coupling and the plug, are positioned in such a way that automatic contacting is possible. This means that the coupling and the plug are positioned on top of each other and separated by a small gap, as can be seen in particular in FIG. 4. This is ensured by means of the corresponding guiding bolt 15 on the housing 16 of the inverter 3, which is moved accordingly in the guiding device 9. Therefore, the inverter 3 only has to be guided down along the vertical guiding groove 14 in order for the contacting of the plug connector 7 to happen automatically. This movement substantially covers the length of the contacting elements of the coupling plus the gap. In addition, guiding elements may be integrated into the coupling and/or the plug of the plug connector so that the contacting elements within the plug will not be damaged and exact positioning is made possible.

The second criterion is concerned with the general protection of the plug connector 7. On the one hand, the weight of the inverter 3 has to be borne by the mounting 6, and on the other hand, at the same time, the required contacting in the plug connector 7 has to be maintained, as can be seen in particular in FIGS. 5 and 6. Accordingly, the length of the vertical guiding groove 14 of the guiding device 9 is adapted so as to connect the plug and the coupling of the plug connector 7 while preventing that they have to bear the weight of the inverter 3. The guiding bolts 15 abut on the lower ends of the respective vertical guiding grooves 14 and bear the weight of the inverter 3.

In addition to the general protection of the plug connector 7, the third criterion regards the protection of the inverter 3 as well, by avoiding an undesirable change of the position of the inverter 3 in the horizontal direction via the abutting guiding bolts 15. In this way, the inverter 3 is supposed to be fixed in a secure position after hooking. This is achieved because the width and/or the diameter of the guiding bolts 15 substantially correspond(s) to the width of the vertical guiding groove 14.

As can be seen in FIGS. 2 to 8, the first part 8 of the plug connector 7 or the coupling is attached to a block 17, which in turn is attached to the mounting 6. This block 17 is intended to protect the inside of the housing 16 of the inverter 3, i.e. the electronic elements which form the inverter 3, from humidity in accordance with the required IP class after the inverter 3 has been hooked to the mounting 6. In order to put this fourth criterion into effect, the housing 16 comprises a seal in the region of the plug connector 7, creating the required sealing together with the block 17 after the inverter 3 has been hooked to the mounting 6. Accordingly, the through channels in the angle of the rear wall 11 and/or in the block 17, which have been mentioned above, are equipped with a corresponding seal as well. The angle can also be part of the block 17.

In this way, a very compactly made up inverter 3 can be connected to the connection cables 5 in a very simple manner. The compact make-up of the inverter 3 here refers in particular to the second part 10 of the plug connector 7, i.e. the plug, which may be arranged in a protected position at the back of the housing 16 of the inverter 3, as no accessibility to the plug connector 7 is required. The compact make-up can be seen in FIGS. 7 and 8. Herein, the back of the housing 16 of the inverter 3 with the integrated second part 10 of the plug connector 7 (plug) as well as the first part 8 of the plug connector 7, attached to the block 17 and subsequently to the not illustrated mounting 6, are shown. In this figure, the second part 10 of the plug connector 7 or plug is covered by the housing 16. FIG. 7 shows the disconnected plug connector 7 and FIG. 8 shows the plug connector 7 in contact. Preferably, the plug is protected by the housing 16 of the inverter 3 and directly connected to a circuit board in the inverter 3. The plug is adjusted to the maximum power of the inverter 3, and the cross-sections of the connection cables 5 are adjusted to the power of the photovoltaic system 1, which mainly depends on the number of solar modules 2. The coupling for connecting the connection cables 5 is formed with a different cross-section. Preferably, this is achieved in a simple manner by screwing the connection cables 5 to the coupling. No special tools or plugs on the connection cables 5 are required for this, so a quick connecting of the connection cables 5 is made possible.

In addition, a housing 16 made of lightweight materials, such as plastic, aluminium or the like, can also be employed for a compact make-up of the inverter 3. When using a housing 16 made of plastic, the inverter 3 may, for example, be protected by a metal cap after being hooked and automatically contacted. Preferably, it will be connected to the mounting 6 by screwing, so that the inverter 3 together with the mounting 6 conforms to the regulations for electromagnetic compatibility (EMC) as well.

Of course, the automatic contacting may also be achieved by first hooking the inverter 3 and connecting the plug to the coupling while pushing it towards the rear wall 11. In this case, the contacting elements of the plug connector 7 are not arranged vertically, but horizontally. Accordingly, further similar versions for implementing the automatic contacting are possible. In particular, the principle according to the invention is independent from where the plug and/or the coupling of the plug connector 7 is/are arranged. The guiding device 9 as well may be arranged, for example, in the rear wall 11 of the mounting 6. It is essential, however, for the guiding device 9 to be positioned in the mounting 6 in such a way that it is aligned with the position of the coupling of the plug connector 7. This guarantees that the plug is automatically brought into contact with the coupling of the plug connector 7 when the inverter 3 is hooked to the mounting 6.

Furthermore, it may be provided in the plug connector 7 that an over-voltage protection circuit and/or like functions are activated in the inverter 3 during automatic contacting. The function of the over-voltage protection circuit will not be discussed in more detail here as it is widely known from the state of the art. The activation is preferably effected by using a bridge, which is arranged between two contacting elements in the coupling of the plug connector 7, substantially as a switch to activate, for example, the over-voltage protection circuit.

Preferably, a gap is provided at least partially between the rear wall 11 and the plug connector 7, so that possible water ingress and/or water formed by condensation can drain.

In general, it should be noted that the principle of the mounting 6 according to the invention can also be used instead of or in addition to the inverter 3, for example, in what is called a string control for monitoring the strings of a photovoltaic system, as it is known from the state of the art.

The invention claimed is:

1. A mounting (6) for an inverter (3) of a photovoltaic system (1), which is designed to detachably accommodate the inverter (3), wherein the inverter (3) can be connected to at least one solar module (2) and an alternating current supply (4) via at least one connection cable (5) for each, and a first part (8) of a plug connector (7) for connecting the connection cables (5) of the inverter (3) and, furthermore, devices (9) for guiding the inverter (3) are provided, which guiding devices (9) are designed to automatically contact the first part (8) of the plug connector (7) with a second part (10) of the plug connector (7) that is arranged on the inverter (3), wherein the mounting (6) is formed by a rear wall (11) and two side walls (12) and the guiding devices (9) are integrated into the side walls (12) of the mounting (6), wherein the guiding devices (9) are formed by a first horizontal guiding groove (13) and a second vertical guiding groove (14) for guiding the inverter (3) in at least two steps, so that during the guiding down along the vertical guiding groove (14) the automatic contacting between the first part (8) and the second part (10) of the plug connector (7) is effected, wherein the guiding devices (9) are designed in such a way that after the first step, the first part (8) of the plug connector (7) is positioned for automatic contacting with respect to the second part (10) of the plug connector (7), and wherein the guiding devices (9) are designed in such a way that after the at least second step, the inverter (3) is secured within the guiding devices (9).

2. A method for fitting an inverter (3) of a photovoltaic system (1), wherein a housing (16) of the inverter (3) is hooked to a mounting (6), which mounting (6) is formed by a rear wall (11) and two side walls (12), and guiding devices (9) are integrated into the side walls (12) of the mounting (6), wherein the guiding devices (9) are formed by a first horizontal guiding groove (13) and a second vertical guiding groove (14) for guiding the inverter (3) in at least two steps, and the inverter (3) is connected to at least one solar module (2) and an alternating current supply (4) via at least one connection cable (5) for each, wherein the connection cables (5) are first connected to a part (8) of a plug connector (7) that is connected to the mounting (6), and then the inverter (3), which is provided with a second part (10) of the plug connector (7), is automatically contacted with the first part (8) of the plug connector (7) by being hooked to the mounting (6) during the guiding down along the vertical guiding groove (14), wherein after being hooked to the mounting (6), the inverter (3) is secured in a position in which the parts (8, 10) of the plug connector (7) are contacted.

3. The fitting method according to claim 2, wherein the inverter (3) is secured within the mounting (6) by means of guiding bolts (15) in corresponding guiding grooves (14).

4. The fitting method according to claim 2, wherein a cap for shielding the inverter (3) is connected to the mounting (6).

5. The fitting method according to claim 2, wherein during connection of the parts (8, 10) of the plug connector (7) an over-voltage protection circuit of the inverter (3) is activated.

* * * * *